United States Patent
Moriyama et al.

(10) Patent No.: US 9,953,898 B2
(45) Date of Patent: Apr. 24, 2018

(54) FLOW CHANNEL MEMBER, AND HEAT EXCHANGER AND SEMICONDUCTOR MODULE EACH USING SAME

(71) Applicant: KYOCERA Corporation, Kyoto-shi, Kyoto (JP)

(72) Inventors: Masayuki Moriyama, Kirishima (JP); Yuusaku Ishimine, Aira (JP); Kazuhiko Fujio, Satsumasendai (JP); Keiichi Sekiguchi, Aira (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 15/313,021

(22) PCT Filed: May 25, 2015

(86) PCT No.: PCT/JP2015/064924
§ 371 (c)(1),
(2) Date: Nov. 21, 2016

(87) PCT Pub. No.: WO2015/182553
PCT Pub. Date: Dec. 3, 2015

(65) Prior Publication Data
US 2017/0200668 A1 Jul. 13, 2017

(30) Foreign Application Priority Data
May 28, 2014 (JP) ................................ 2014-110307

(51) Int. Cl.
*H01L 23/473* (2006.01)
*F28F 21/04* (2006.01)
(Continued)

(52) U.S. Cl.
CPC ........ *H01L 23/473* (2013.01); *F28D 1/05316* (2013.01); *F28F 1/12* (2013.01);
(Continued)

(58) Field of Classification Search
CPC .... H01L 23/473; H01L 23/3675; F28F 21/04; F28D 1/05316
See application file for complete search history.

(56) References Cited

U.S. PATENT DOCUMENTS 4,794,983 A * 1/1989 Yoshida ................ F28D 15/046
165/133
8,356,658 B2 * 1/2013 Bunker ................. F28F 13/185
165/109.1
(Continued)

FOREIGN PATENT DOCUMENTS

JP 60-165498 A 8/1985
JP 63-189793 A 8/1988
(Continued)

OTHER PUBLICATIONS

International Search Report (Form PCT/ISA/210) dated Jul. 7, 2015, issued for PCT/JP2015/064924.
Written Opinion (Form PCT/ISA/237) dated Jul. 7, 2015, issued for PCT/JP2015/064924.

*Primary Examiner* — Dung Le
(74) *Attorney, Agent, or Firm* — Procopio Cory Hargreaves and Savitch LLP

(57) ABSTRACT

A flow channel member according to the present invention includes a ceramic substrate, a flow channel inside the ceramic substrate through which a fluid flows, and multiple protrusions on an outer surface of the substrate.

7 Claims, 5 Drawing Sheets

(51) Int. Cl.
 *F28F 1/12* (2006.01)
 *F28D 1/053* (2006.01)
 *H01L 23/367* (2006.01)
 *H01L 23/373* (2006.01)

(52) U.S. Cl.
 CPC .......... *F28F 21/04* (2013.01); *H01L 23/3675* (2013.01); *H01L 23/3736* (2013.01); *F28F 2255/18* (2013.01); *F28F 2260/00* (2013.01)

(56) References Cited

U.S. PATENT DOCUMENTS

| | | | | |
|---|---|---|---|---|
| 2011/0251698 | A1* | 10/2011 | Gupta | A61F 2/30767 623/23.56 |
| 2012/0118344 | A1* | 5/2012 | Schluck | F01N 5/025 136/201 |
| 2014/0332191 | A1* | 11/2014 | Jarmon | F28F 21/04 165/154 |
| 2015/0084261 | A1* | 3/2015 | Sekiguchi | F28F 21/04 269/290 |
| 2017/0040193 | A1* | 2/2017 | Inoue | H01L 21/67109 |

FOREIGN PATENT DOCUMENTS

| | | |
|---|---|---|
| JP | 2001-324289 A | 11/2001 |
| JP | 2003-065630 A | 3/2003 |
| JP | 2010-173873 A | 8/2010 |

* cited by examiner

US 9,953,898 B2

FLOW CHANNEL MEMBER, AND HEAT EXCHANGER AND SEMICONDUCTOR MODULE EACH USING SAME

TECHNICAL FIELD

The present invention relates to a flow channel member, and a heat exchanger and a semiconductor module including the same.

BACKGROUND ART

Cooling or heating systems in various different devices include a flow channel member including a substrate including a flow channel through which a fluid flows inside thereof. When a low-temperature or high-temperature fluid is caused to flow through the flow channel of the flow channel member, heat is exchanged between an object external to the substrate and the fluid flowing inside the substrate with the substrate interposed therebetween, so that the object can be cooled or heated. For example, when an object is a high temperature gas resulting from operations of various devices, a low temperature liquid is caused to flow through the flow channel and the high temperature gas, which is the object, is brought into contact with the outer surface of the substrate to exchange heat with the low temperature liquid, so that the high temperature gas, or the object, is cooled.

In some cases, a highly corrosive fluid is used as the above-described high temperature gas or low temperature liquid. In addition, the flow channel member itself is required to be durable for long term use. In response to these requirement, flow channel members including a substrate made of a ceramic, having high corrosion resistance and high mechanical characteristics, have been developed (see, for example, PTL 1).

CITATION LIST

Patent Literature

PTL 1: Japanese Unexamined Patent Application Publication No. 2010-173873

SUMMARY OF INVENTION

Technical Problem

Recent flow channel members are required to have higher heat-exchange efficiency.

The present invention thus aims to provide a flow channel member having high heat-exchange efficiency, a heat exchanger including the flow channel member, and a semiconductor module including the flow channel member.

Solution to Problem

A flow channel member according to the present invention includes a substrate, made of a ceramic and including a flow channel inside thereof, and multiple protrusions disposed on an outer surface of the substrate.

A heat exchanger according to the present invention includes multiple flow channel members each corresponding to the flow channel member, a fluid inlet member disposed between the flow channel members and communicating with inlet ports of the flow channels in the respective flow channel members, and a fluid outlet member disposed between the flow channel members and communicating with outlet ports of the flow channels in the respective flow channel members.

A semiconductor module according to the present invention includes the flow channel member, a metal layer on a protrusion surface of the flow channel member, the protrusion surface including the protrusions, and a semiconductor device on the metal layer.

Advantageous Effects of Invention

The flow channel member according to the present invention has high heat-exchange efficiency.

The heat exchanger according to the present invention is capable of efficiently exchanging heat with an object.

The semiconductor module according to the present invention includes the semiconductor device that is capable of producing a high performance for a long time period since the temperature of the semiconductor device is regulated so as not to rise excessively during its operation.

BRIEF DESCRIPTION OF DRAWINGS

FIG. 1 illustrates an example of a flow channel member according to an embodiment, where

FIG. 2 illustrates another example of a flow channel member according to an embodiment, where

FIG. 3 illustrates another example of a flow channel member according to an embodiment, where

FIG. 4 illustrates an example of a heat exchanger according to an embodiment, where

FIG. 5 illustrates an example of a semiconductor module according to an embodiment, where

DESCRIPTION OF EMBODIMENTS

Figure 1A:
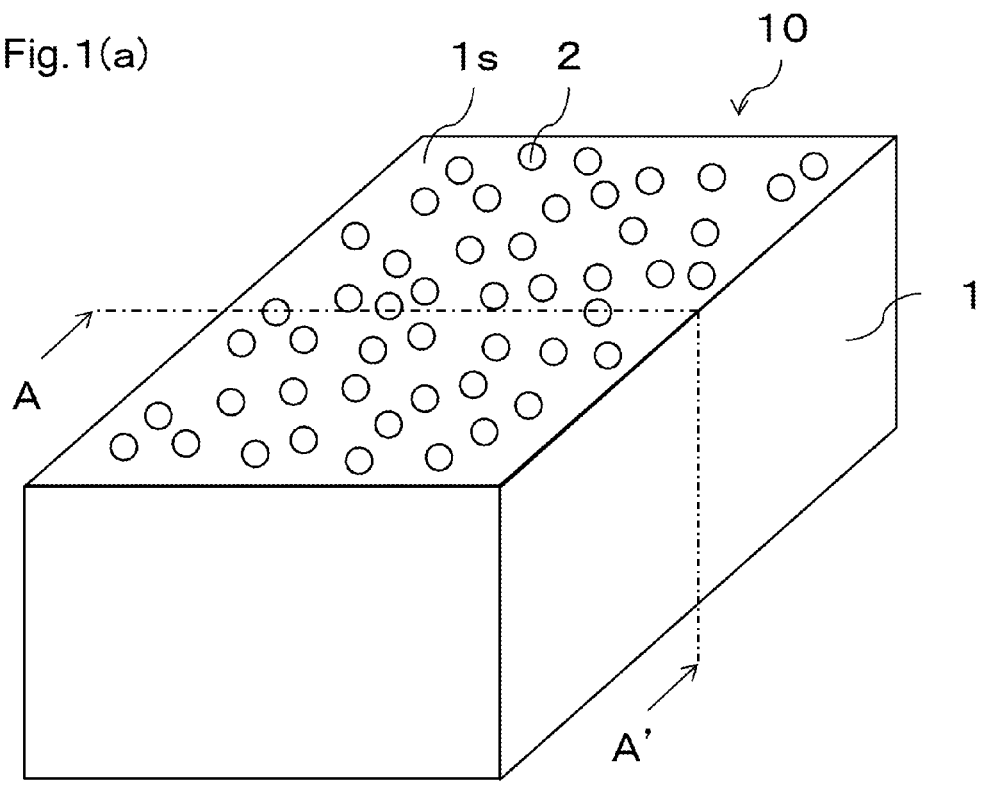
FIG. 1(a) is a perspective view of the flow channel member and FIG. 1(b) is a sectional view of the flow channel member taken along line A-A' of FIG. 1(a).

Referring now to the drawings, a flow channel member according to an embodiment is described in detail. Throughout the drawings, the same components are denoted with the same reference symbol. The drawings are shown only schematically. The size of each component, the positional relationship between components, or other details in each drawing is not accurately shown.

Figure 1B:
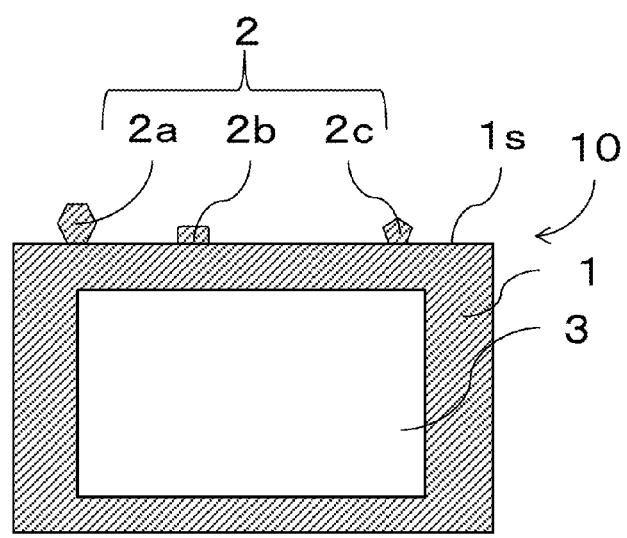

FIG. 1(a) is a perspective view of an example of a flow channel member according to an embodiment and FIG. 1(b) is a sectional view of the flow channel member taken along line A-A' of FIG. 1(a).

A flow channel member 10 illustrated in FIG. 1(a) and FIG. 1(b) includes a substrate 1 made of a ceramic. The substrate 1 defines a flow channel 3, through which a fluid flows, inside itself. Since the substrate 1 is made of a ceramic, the flow channel member 10 has high corrosion resistance and high mechanical characteristics. FIG. 1(a) does not illustrate an inlet port and an outlet port that connect the flow channel 3 to the outside, but at least one inlet port and at least outlet port are included.

When an object is a high temperature gas resulting from, for example, operations of different devices, the flow channel member 10 causes a low temperature fluid to flow through the flow channel 3 to bring the high temperature gas, which is an object, into contact with the outer surface of the substrate 1 so that the low-temperature fluid and the high temperature gas exchange heat between themselves. Here, an effect is described using an example where the object is a gas. However, the object is not limited to a gas and may be a liquid or a solid.

Here, the flow channel member 10 according to this embodiment includes multiple protrusions 2 on the outer surface of the substrate 1. As illustrated in FIG. 1(b), the protrusions 2 here represent the portions on the outer surface of the substrate 1 protruding beyond a line connecting portions of the outer surface on which the protrusions 2 are not disposed. In FIG. 1(a), the surface on which the protrusions 2 are disposed is denoted with the reference symbol 1s. In the following description, the outer surface of the substrate 1 on which the protrusions 2 are disposed is described as a protrusion surface 1s.

Since the substrate 1 has the protrusion surface 1s, the outer surface area of the substrate 1 increases, whereby the heat-exchange efficiency can be enhanced. FIG. 1(a) illustrates an example where only one of the outer surfaces of the substrate 1 is a protrusion surface 1s. However, the substrate 1 suffices if it includes one or more protrusion surfaces is. Naturally, an increase in number of protrusion surfaces is further enhances the heat-exchange efficiency.

In the section illustrated in FIG. 1(b), preferably in terms of enhancement of heat-exchange efficiency, the protrusions 2 include portions, such as a protrusion 2a or a protrusion 2c, that has a larger dimension in a direction away from the flow channel 3 than a dimension parallel to the protrusion surface 1s. This is because the protrusions 2 having such shapes increase the surface area of the protrusions 2. When, for example, the object is a gas, the portions of the protrusions 2 having large dimensions can guide the gas toward the protrusion surface 1s, so that the heat-exchange efficiency can be further enhanced.

Preferably, the areal coverage percentage of the protrusions 2 on the protrusion surface is illustrated in FIG. 1(a) is 30% or more with respect to a total area of the protrusion surface is of 100%. One conceivable way of measuring the areal coverage percentage is described as follows. The protrusion surface 1s is viewed from the front using a device such as a scanning electron microscope (SEM) or a metallurgical microscope. For example, multiple observation regions within a range of approximately 4 mm×3 mm are selected from the protrusion surface is. Images of these observation regions are captured. The areal coverage percentage of the protrusions 2 in each image is calculated using image analysis software. The mean value of these areal coverage percentages is calculated and defined as the areal coverage percentage of the protrusions 2. Another conceivable way of measuring the areal coverage percentage is described as follows. The protrusion surface 1s is viewed from the front using a laser microscope. Multiple observation regions within a range of approximately 4 mm×3 mm are selected from the protrusion surface 1s. The locations of the protrusions 2 are specified through three-dimensional measurement of the laser microscope to obtain the areal coverage percentage of the protrusions 2. The mean value of the areal coverage percentages is calculated and defined as the areal coverage percentage of the protrusions 2.

Examples usable as the material of the substrate 1 include oxide ceramics, such as a sintered alumina member or a sintered cordierite member, and nonoxide ceramics, such as a sintered silicon nitride member, a sintered aluminium nitride member, or a sintered silicon carbide member.

A sintered member having, for example, a silicon carbide content of 70 weight percent or higher with respect to the entire content of the sintered member of 100 weight percent is a sintered silicon carbide member. When silicon carbide is the only silicon-containing compound identified by an X-ray diffractometer (XRD), the silicon carbide content can be obtained by quantitatively determining silicon (Si) using an inductively coupled plasma spectrometry device (ICP) or a fluorescent X-ray analyzer (XRF) and converting the quantity of silicon into the quantity of silicon carbide (SiC). When silicon carbide is the only carbon-containing compound identified by using a XRD, carbon (C) may be quantitatively determined by a carbon analyzer and the quantity of carbon may be converted into the quantity of silicon carbide. Alternatively, a qualitative analysis may be performing using a ICP or a XRF and the content of the portion remaining after calculating the contents of the components other than silicon carbide may be defined as a silicon carbide content.

The content of a sintered alumina member, a sintered cordierite member, a sintered silicon nitride member, or a sintered aluminium nitride member is similarly obtained.

To further enhance the heat-exchange efficiency in addition to an increase in corrosion resistance or mechanical characteristics, preferably, a ceramic used for making the flow channel member 10 is a sintered silicon carbide member and the protrusions 2 contain silicon carbide grains. The reason why this configuration can further enhance heat-exchange efficiency is because silicon carbide has high thermal conductivity.

Whether the protrusions 2 contain silicon carbide grains may be determined by mechanically removing the protrusions 2 and measuring the removed protrusions 2 with a XRD. If the protrusions 2 are changed into powder while the protrusions 2 are mechanically removed, the powder may be measured by a XRD. Alternatively, the protrusion surface is may be observed by a scanning electron microscope (SEM) and the protrusions 2 may be subjected to energy dispersive X-ray spectroscopy. When peaks of silicon and carbon are found in the obtained data, the protrusions 2 may be regarded as containing silicon carbide grains.

Preferably, half or more of the protrusions 2 are each formed of a single silicon carbide grain. Here, a single silicon carbide grain means that the grain is not bonded and has no grain boundary. A protrusion 2 formed of a single silicon carbide grain does not have such a grain boundary that the protrusion 2 composed of multiple silicon carbide grains has. Since heat conduction is not hindered in the absence of the grain boundary, the heat can be smoothly conducted from the protrusions 2 to the flow channel 3 or from the flow channel 3 to the protrusions 2. When half or more of the protrusions 2 are composed of such a single silicon carbide grain, the heat-exchange efficiency can be further enhanced.

Whether half or more of the protrusions 2 are each formed of a single silicon carbide grain is determined as follows. Sections of the protrusions 2 as illustrated in FIG. 1(b) are observed by a SEM to determine whether each protrusion 2 is composed of multiple silicon carbide grains having a grain boundary or a single silicon carbide grain having no grain boundary. When at least five or more protrusions 2 are found to be formed of a single silicon carbide grain after observation of sections of ten protrusions 2, half or more of the protrusions 2 are regarded as being formed of a single silicon carbide grain.

Preferably, the average grain diameter of a single silicon carbide grain is larger than the average crystal grain diameter of a silicon carbide crystal in the sintered silicon carbide member of the substrate 1. Here, a single silicon carbide grain is synonymous with a silicon carbide crystal and they are merely distinguished here for the purpose of identification. In this configuration, heat can be further smoothly conducted from the protrusions 2 to the flow channel 3 and from the flow channel 3 to the protrusions 2.

The average grain diameter of the single silicon carbide grain and the average crystal grain diameter of the silicon carbide crystal of the sintered silicon carbide member of the substrate 1 are compared with each other in the following manner. First, the average grain diameter of the single silicon carbide grain is determined as follows. The section of the protrusions 2 illustrated in FIG. 1(b) is observed by a SEM to determine whether each protrusion 2 is composed of multiple silicon carbide grains having a grain boundary or a single silicon carbide grain having no grain boundary. The maximum widths of the protrusions 2 determined as being formed of a single silicon carbide grain are measured. The maximum widths of at least ten grains of single silicon carbide grain are measured and the mean of the maximum widths is defined as an average grain diameter of the single silicon carbide grain.

The average crystal grain diameter of a sintered silicon carbide member of the substrate 1 may be determined as follows. The surface from which the protrusions 2 are mechanically removed is prepared as a measurement surface. The measurement surface is observed using a device such as a SEM or a metallurgical microscope. For example, multiple observation regions within a range of approximately 2 mm×1.5 mm are selected from the measurement surface. Images of these observation regions are captured. The average crystal grain diameter of the silicon carbide crystal in each image is obtained by image analysis software, and the mean value of these average crystal grain diameters is calculated and defined as an average crystal grain diameter of the substrate 1.

Preferably, the maximum peak height of the roughness curve of the protrusion surface is falls within a range of 20 μm to 40 μm. The configuration that satisfies this condition can have a larger surface area of the protrusion surface 1s while the protrusions 2 are rendered less likely to be detached from the substrate 1. The configuration can thus further enhance the heat-exchange efficiency.

Here, a method for measuring the maximum peak height of the roughness curve of the protrusion surface is may be as follows. A contact-type surface roughness measuring instrument is used. The maximum peak height of the protrusion surface 1s is measured at at least three points under the conditions where the length of measurement is 12 mm, the cutoff wavelength is 0.8 mm, the measurement speed is at 1.5 mm/s, the cut-off frequency is of a Gaussian filter, and the slope is corrected on both sides. The obtained mean value may be defined as a maximum peak height of a roughness curve of the protrusion surface 1s.

Figure 2A:
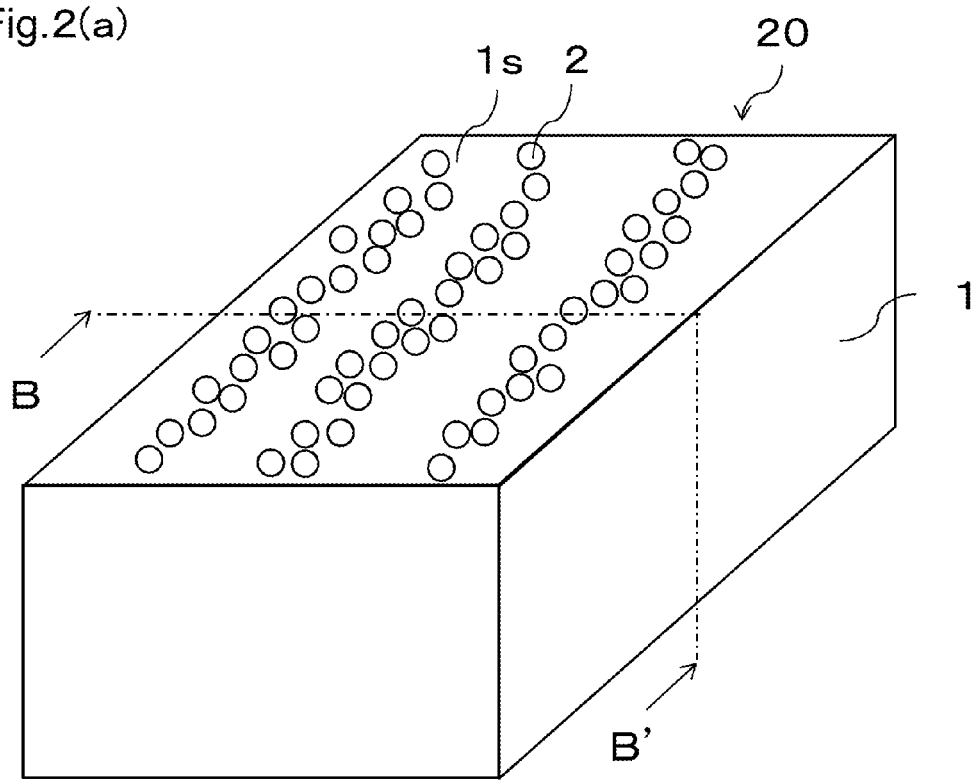
FIG. 2(a) is a perspective view of the flow channel member and FIG. 2(b) is a sectional view of the flow channel member taken along line B-B' of FIG. 2(a).
Figure 2B:
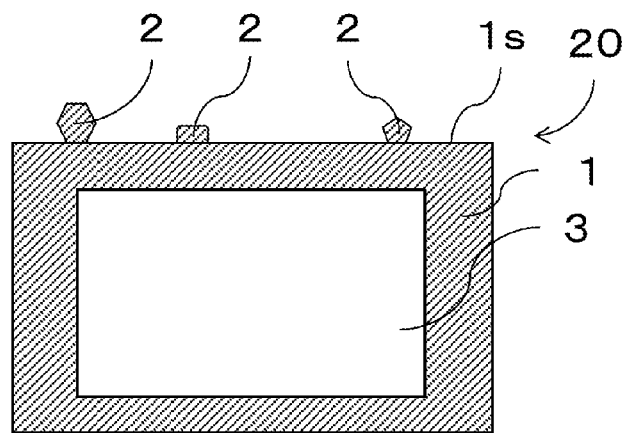

Now, FIG. 2(a) is a perspective view of another example of a flow channel member according to an embodiment and FIG. 2(b) is a sectional view of the flow channel member taken along line B-B' of FIG. 2(a). In FIG. 2(a), the arrow indicating the direction in which the section is viewed denotes the direction in which a fluid flows.

In an example of a flow channel member 20 illustrated in FIG. 2(a), the protrusions 2 are arranged in rows in a direction in which the fluid flows through the flow channel 3. Here, the expression that the protrusions 2 are arranged in rows means that, in a visual-check sense, portions in which a large number of protrusions 2 are disposed and portions in which a small number or none of protrusions 2 are disposed form a seemingly striped pattern.

In the flow channel member 20 having this configuration, an object, if it is a gas or a liquid and flows in the direction the same as the direction in which the fluid flows, is more likely to be guided to portions between the rows and flows along the portions between the rows. Thus, the heat-exchange efficiency is further enhanced.

Figure 3A:
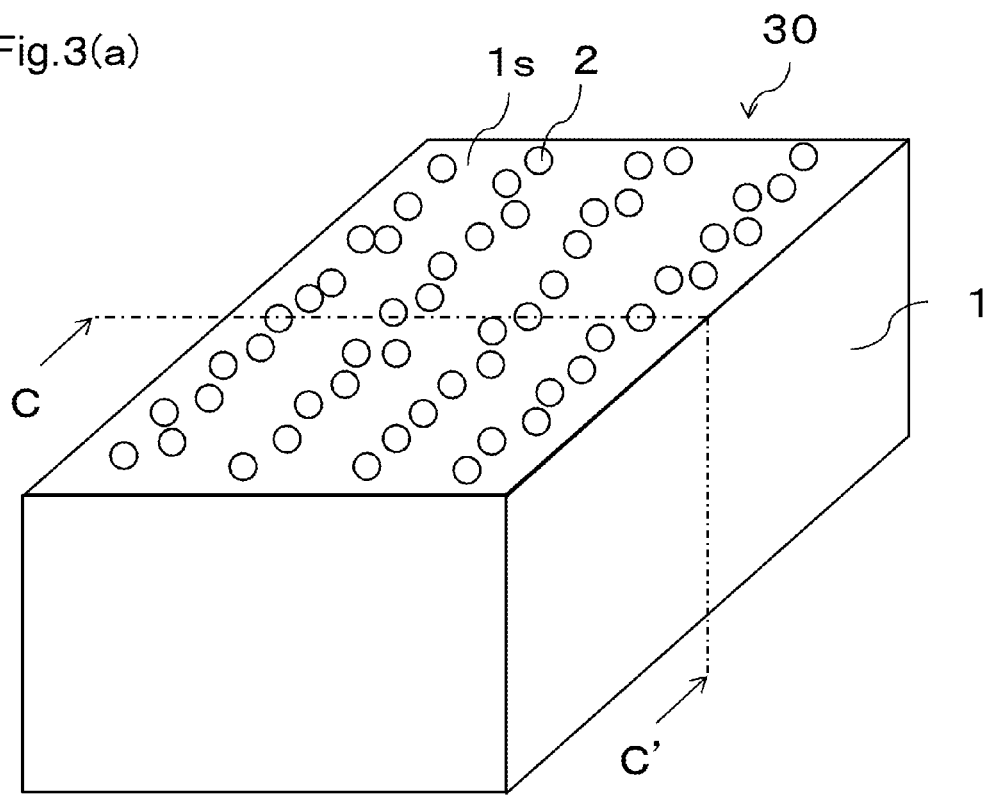
FIG. 3(a) is a perspective view of the flow channel member and FIG. 3(b) is a sectional view of the flow channel member taken along line C-C' of FIG. 3(a).
Figure 3B:
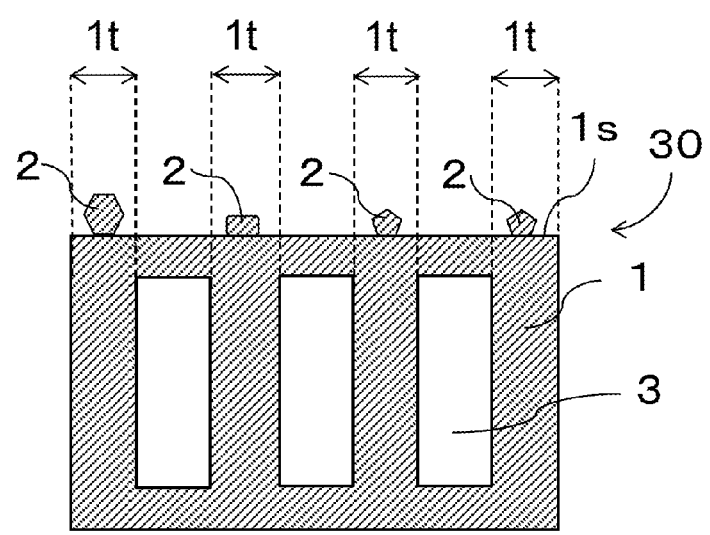

Now, FIG. 3(a) is a perspective view of another example of the flow channel member according to an embodiment and FIG. 3(b) is a sectional view of the flow channel member taken along line C-C' of FIG. 3(a).

In an example of a flow channel member 30 illustrated in FIG. 3(a) and FIG. 3(b), the protrusions 2 are located only in regions 1t of the protrusion surface is except the regions corresponding to the flow channels 3. Here, the regions 1t except the regions corresponding to the flow channels 3 represent the regions excluding the regions of the protrusion surface is immediately above the flow channels 3, as illustrated in FIG. 3(b). In the following description, these regions are described as off-flow-channel regions 1t.

In the flow channel member 20 having this configuration, the presence of the protrusions 2 in the off-flow-channel regions 1t increases the surface area of the off-flow-channel regions 1t and enhances the heat-exchange efficiency in the off-flow-channel regions 1t. Thus, the difference between the thermal stress that occurs in the regions immediately above the flow channels 3 and the thermal stress that occurs in the off-flow-channel regions 1t can be reduced. Thus, the flow channel member 30 having the configuration illustrated in FIG. 3(a) and FIG. 3(b) enables heat exchange for a long term.

Here, whether the protrusions 2 are located only in the off-flow-channel regions 1t can be checked, for example, by the following method. As illustrated in FIG. 3(b), the flow channel member 30 is cut to check the positions of the flow channels 3 and confirm that no protrusions 2 are disposed in the regions of the protrusion surface is of the flow channel member 30 immediately above the flow channels 3. Thus, the protrusions 2 can be regarded as being located only in the off-flow-channel regions 1t of the protrusion surface 1s.

Figure 4A:
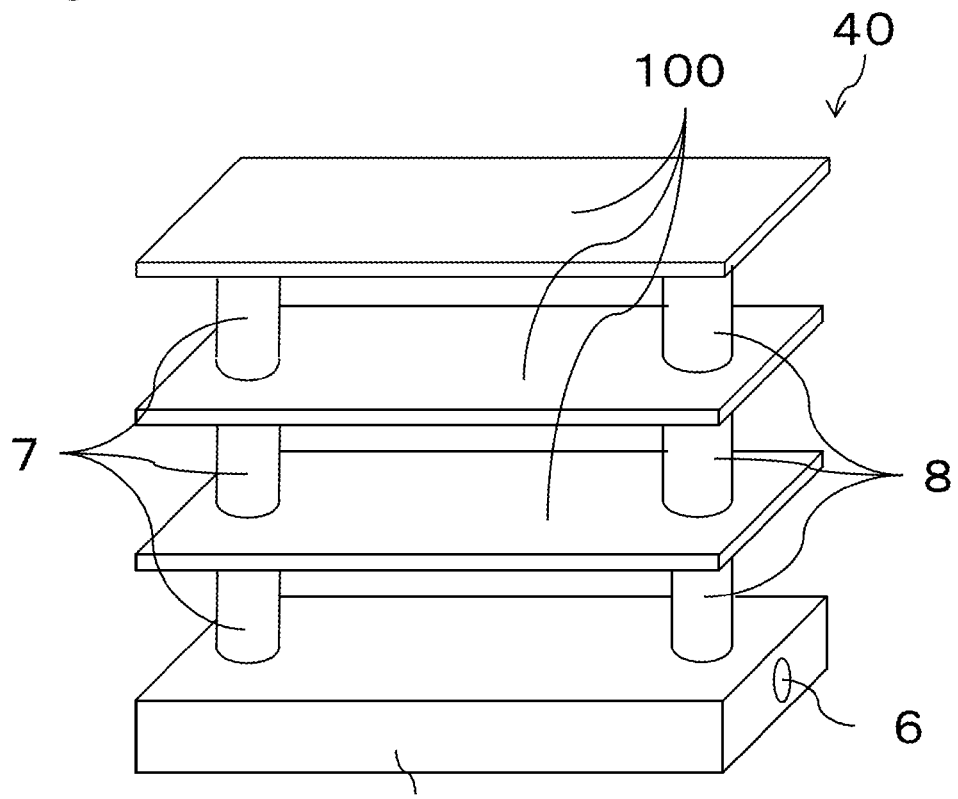
FIG. 4(a) is a perspective view of the heat exchanger and FIG. 4(b) is a sectional view of the heat exchanger.
Figure 4B:
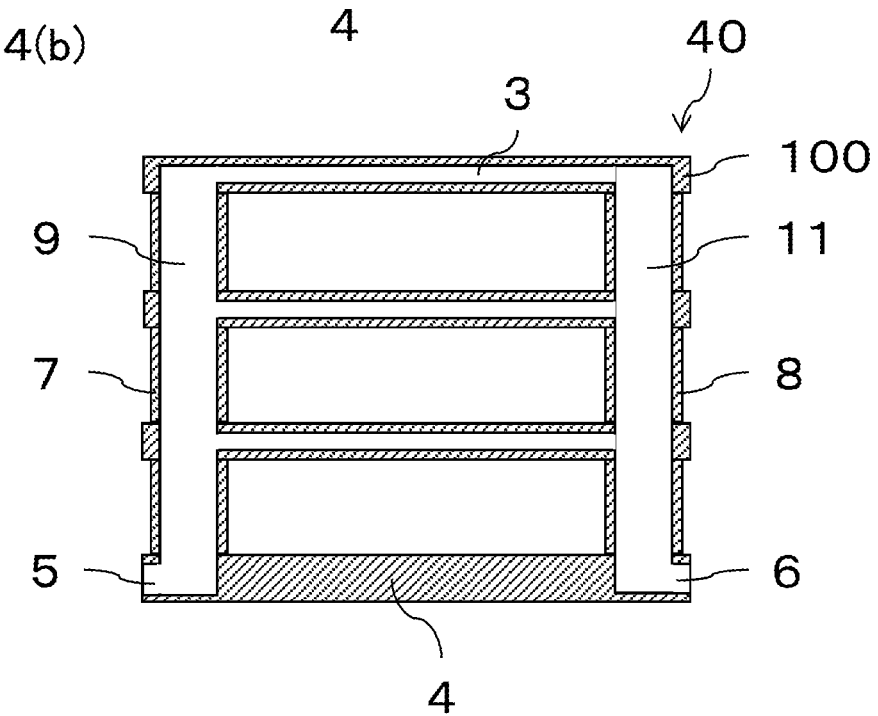

Now, FIG. 4(a) is a perspective view of an example of a heat exchanger according to an embodiment and FIG. 4(b) is a sectional view of the heat exchanger. Any of the flow channel member 10 illustrated in FIG. 1, the flow channel member 20 illustrated in FIG. 2, and the flow channel member 30 illustrated in FIG. 3 is usable in the heat exchanger according to the embodiment. In the drawings and description described below, the flow channel members are denoted with a reference numeral of "100". FIG. 4(a) and FIG. 4(b) do not illustrate the protrusions for simplicity.

A heat exchanger 40 according to the embodiment includes three flow channel members 100, a fluid inlet member 7, and a fluid outlet member 8. The fluid inlet member 7 is disposed between the flow channel members 100 so as to communicate with the inlet ports of the flow channels 3 in the respective flow channel members 100. The fluid outlet member 8 is disposed between the flow channel members 100 so as to communicate with the outlet ports of the flow channels 3 in the respective flow channel members 100. FIG. 4(a) and FIG. 4(b) illustrate an example of the heat exchanger 40 including a base portion 4 at the lowest portion, the base portion 4 including a fluid inlet port 5 and a fluid outlet port 6. An inlet-side flow channel formed mainly inside the fluid inlet member 7 and located continuous with the inlet port 5 is denoted with the reference numeral "9" and an outlet-side flow channel formed mainly inside the fluid outlet member 8 and located continuous with the outlet port 6 is denoted with the reference numeral "11".

The fluid flows from the inlet port 5 through the inlet-side flow channel 9 to the flow channels 3 in the respective flow channel members 100. The fluid that has passed through the flow channels 3 flows through an outlet-side flow channel 11 and is discharged from the outlet port 6. In the heat exchanger 40, the object flows between adjacent flow channel members 100 and between the lowest flow channel member 100 and the base portion 4. The heat exchanger 40 according to the embodiment having the above-described configuration includes multiple flow channel members 100 according to the embodiment. Thus, the heat exchanger 40 is capable of efficiently exchanging heat with the object.

Preferably, the flow channels 3 in the flow channel members 100 have a configuration that allows the fluid to flow efficiently. For example, a configuration in which the opening area of each flow channel 3 at a portion near the fluid inlet member 7 is larger than the opening area of the fluid at a portion near the fluid outlet member 8 allows the fluid to smoothly flow to the flow channel 3 from the inlet-side flow channel 9. Such a configuration can thus enhance the efficiency of heat exchange with the object.

Preferably, the fluid inlet member 7 or the fluid outlet member 8 is joined to the flow channel members 100 at portions at which multiple protrusions are disposed. In a configuration satisfying this condition, the flow channel members 100 and the fluid inlet member 7 or the fluid outlet member 8 are joined together at high bonding strength, so that the fluid is less likely to leak from the joints. This configuration thus has high reliability in addition to high heat-exchange efficiency of the configuration of the heat exchanger 40.

Figure 5A:
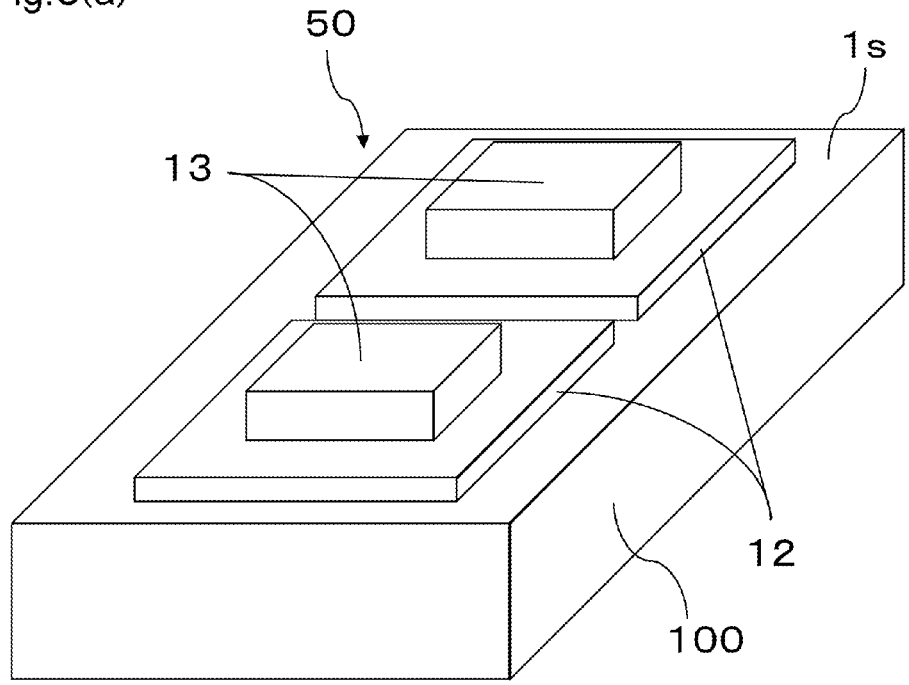
FIG. 5(a) is a perspective view of the semiconductor module and FIG. 5(b) is a sectional view of the semiconductor module.
Figure 5B:
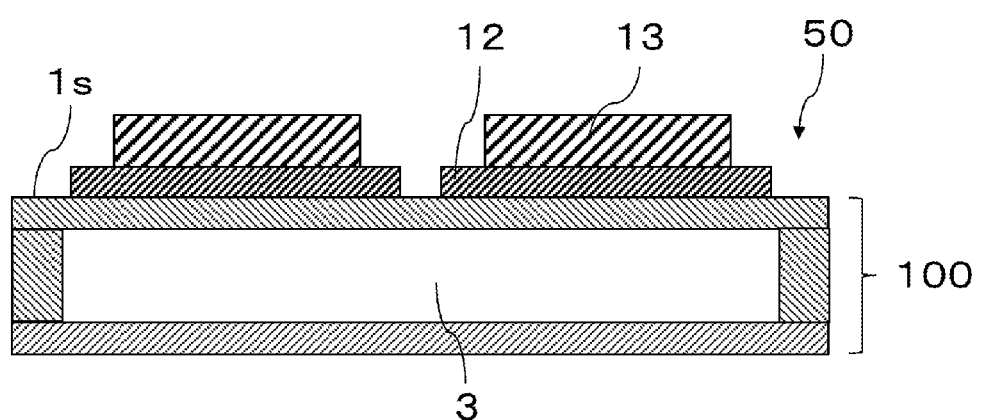

Now, FIG. 5(a) is a perspective view of an example of a semiconductor module according to the embodiment and FIG. 5(b) is a sectional view of the semiconductor module. FIG. 5(a) and FIG. 5(b) do not illustrate protrusions for simplicity.

A semiconductor module 50 according to the embodiment includes metal layers 12, disposed on the protrusion surface is of the flow channel member 100, and semiconductor devices 13, mounted on the metal layers 12. FIG. 5 illustrates an example of the semiconductor module 50 that includes two semiconductor devices 13 on the flow channel member 100. However, the number of semiconductor devices 13 is not limited to two and may be one, three, or more than three.

The semiconductor module 50 according to the embodiment causes a low-temperature fluid to flow through the flow channel 3 of the flow channel member 100, so that the temperature of the semiconductor devices 13 is regulated so as not to rise excessively during their operations. The semiconductor devices 13 are thus capable of producing a high performance for a long time period.

In addition, the presence of the protrusions facilitates transmission of heat produced by the semiconductor devices 13 to the flow channel 3. Thus, disposition of multiple semiconductor devices 13 renders heat of each semiconductor device 13 less likely to interfere with an adjacent semiconductor device 13. In addition, when multiple semiconductor devices 13 are disposed, the presence of protrusions increases the creepage distance between adjacent semiconductor devices 13, whereby the creepage surface resistance increases and the semiconductor devices 13 have higher electrical reliability.

Preferably, the metal layers 12 are mainly composed of a metal such as copper, silver, or aluminum. The metal layers 12 mainly composed of such a metal have low electric resistivity, and are thus compatible with a strong allowable current. In addition, the metal layers 12 mainly composed of such a metal have high thermal conductivity and the surfaces of the metal layers 12 have high heat dispersion characteristics. Thus, the temperature of the semiconductor devices 13 is regulated so as not to rise excessively.

Now, methods for manufacturing the flow channel member 100 according to the embodiment, the heat exchanger 40 including the flow channel member 100, and the semiconductor module 50 including the flow channel member 100 are described.

First, a sintering agent, a binder, a solvent, a dispersing agent, and the like are added to a powdery material (such as silicon carbide or alumina), which is a main component. These materials are appropriately mixed together to form slurry. Then, the slurry is formed into a ceramic green sheet by doctor blading and pieces having a product shape are punched out from the ceramic green sheet using a stamping die. The punched-out pieces of the ceramic green sheet are laminated together into a member, which is a laminate. Another conceivable way of manufacturing a ceramic green sheet is as follows. The slurry is spray dried and granulated by spray granulation (spray drying) to form granules and the granules are formed by roll memberion.

Another conceivable way of forming a member is as follows. A sintering agent, a binder, a solvent, and the like are added to a powdery raw material (such as silicon carbide or alumina), which is a main component, to prepare a pug, and the pug is formed into a tubular member by extrusion molding. A member for closing the openings of the tubular member is formed using granules by mechanical pressing or cold isostatic pressing (CIP) and these members are joined by slurry.

Subsequently, the protrusions 2 are formed on the surface of the member, which is to serve as the substrate 1. The protrusions 2 can be formed by, for example, transferring the protrusion pattern by pressing a die having recesses against the member or by cutting the surface of the member by laser processing or blasting.

To render half or more protrusions 2 formed of a single silicon carbide grain, silicon carbide powder may be sprinkled on the surface of the member, which is to serve as the substrate 1, using a device such as a sieve such that grains do not overlap one another. Alternatively, a solvent or the like may be added to the silicon carbide powder to form slurry and the slurry may be applied to the surface of the member using a device such as a brush or a roller. In order that the single silicon carbide grain has an average grain diameter larger than an average crystal grain diameter of a silicon carbide crystal of the substrate 1, silicon carbide powder used for silicon carbide grains may have a grain diameter larger than that of silicon carbide powder used for the member, which is to serve as the substrate 1.

In addition, the maximum peak height of the roughness curve of the protrusion surface is can be rendered within a range of 20 μm to 40 μm by adjusting the size of the recesses in the die that is to be pressed against the surface, appropriately determining the process pattern in laser processing or blasting, or using a powdery raw material (such as silicon carbide or alumina), which is a main component, selected so that the grain diameters fall within a range of 20 μm to 40 μm.

Moreover, the positions of the protrusions 2 on the protrusion surface is can be freely determined by adjusting the positions of the recesses in the die that is to be pressed against the surface, appropriately determining the process pattern in laser processing or blasting, or sprinkling a powdery raw material (such as silicon carbide or alumina), which is to serve as a main component, on the surface of the member or applying the slurry to the surface of the member using a plate having an intended shape.

Firing the member thus obtained completes a sintered member, which is to serve as the flow channel member 100. Naturally, some portions may be subjected to cutting as needed after firing.

An example of a method for manufacturing the heat exchanger 40 illustrated in FIG. 4(*a*) is described as a method for manufacturing the heat exchanger 40 according to the embodiment.

First, a base portion 4 composed of a ceramic and including an inlet port 5 and an outlet port 6 is prepared. A member having an inlet port and an outlet port in the undersurface is prepared as the uppermost flow channel member 100. Members each having through holes at positions corresponding to the inlet-side flow channel 9 and the outlet-side flow channel 11 are prepared as the remaining two flow channel members 100.

The tubular fluid inlet member 7 and the tubular fluid outlet member 8, each having an opening at a portion corresponding to the position of the flow channel member 100, are prepared. Then, the flow channel member 10 having an undersurface in which an inlet port and an outlet port are formed is placed such that the undersurface faces upward. The tubular fluid inlet member 7 is placed upright at the position corresponding to the inlet port and the tubular fluid outlet member 8 is placed upright at the position corresponding to the outlet port. A glass paste or another material used for a bonding agent is applied to the joints.

Subsequently, a support strut having a height corresponding to the interval between the flow channel members 100 is placed upright on the undersurface. Then, the flow channel member 100 having through holes at the positions corresponding to the inlet-side flow channel 9 and the outlet-side flow channel 11 is fitted to the fluid inlet member 7 and the fluid outlet member 8. Subsequently, a bonding agent is applied to the joints. Examples of bonding agents used here include a glass powder of the system $SiO_2$—$Al_2O_3$—$B_2O_3$—RO (where R denotes alkaline-earth metal element) and paste containing ceramic powder in which metal silicon powder and silicon carbide powder are mixed, which are inorganic adhesives having high thermal resistance and high corrosion resistance. Use of any of such inorganic adhesives as a bonding agent minimizes the heat treatment temperature. Thus, the heat treatment does not cause degradation of each component, whereby the components can be firmly bonded together and the reliability can be enhanced. Then, a series of processes from placing a support strut to applying a bonding agent is repeated again. Here, preferably, the support struts are made of a material that shrinks during the heat treatment of the bonding agent so as to be removable after the heat treatment.

Subsequently, another support strut is placed upright. Then, the base portion 4 is placed such that the portion of the base portion 4 corresponding to the inlet port 5 is aligned with the fluid inlet member 7 and the portion of the base portion 4 corresponding to the outlet port 6 is aligned with the fluid outlet member 8. A bonding agent is then applied to the joints.

The resultant structure is then subjected to heat treatment at a predetermined temperature, whereby the heat exchanger 40 according to the embodiment can be obtained.

In an example in the above-described method, the fluid inlet member 7 and the fluid outlet member 8 extend through the multiple flow channel members 100. Instead, fluid inlet members 7 and fluid outlet members 8 each having a height corresponding to an interval between adjacent flow channel members 100 may be used, as illustrated in FIG. 4(*b*). When the fluid inlet members 7 and the fluid outlet members 8 having a height corresponding to an interval between adjacent flow channel members 100 have inner diameters larger than the diameters of the inlet ports and the outlet ports of the flow channel members 100, the heat exchanger 40 can be manufactured without using support struts.

Subsequently, an example of a method for manufacturing the semiconductor module 50 illustrated in FIG. 5(*a*) is described as a method for manufacturing the semiconductor module 50 according to the embodiment.

First, two metal layers 12 are placed apart from each other on the protrusion surface is of the flow channel member 100. The metal layers 12 can be obtained by, for example, the following method. Paste is produced from electrically conductive powder, such as silver, copper, or aluminum, glass powder, and an organic vehicle. The paste is printed on the protrusion surface is by known screen-printing. After the paste is dried, the paste is fired in the atmosphere suitable for the electrically conductive powder. Other examples of a method for manufacturing the metal layers 12 include electroplating, electroless plating, and direct bonding and active-metal soldering involving the use of a copper sheet or an aluminum sheet.

Then, the semiconductor devices 13 are mounted on the respective metal layers 12, so that the semiconductor module 50 according to the embodiment can be obtained.

Although the invention has been described in detail thus far, the invention is not limited to the above-described embodiments and may be modified, improved, or changed in various other ways within the scope not departing from the gist of the invention.

REFERENCE SIGNS LIST substrate
protrusion
flow channel
base portion
inlet port
outlet port
fluid inlet member
fluid outlet member
inlet-side flow channel
outlet-side flow channel
metal layer
semiconductor device
10, 20, 30, 100 flow channel member
40 heat exchanger
50 semiconductor module

The invention claimed is:

1. A flow channel member, comprising:
    a substrate containing a sintered silicon carbide member and comprising a flow channel inside thereof; and
    a plurality of protrusions disposed on an outer surface of the substrate, half or more of the protrusions being each formed of a single silicon carbide grain.

2. The flow channel member according to claim 1, wherein an average grain diameter of the single silicon carbide grain is larger than an average crystal grain diameter of a silicon carbide crystal in the sintered silicon carbide member.

3. The flow channel member according to claim 1, wherein a roughness curve of a protrusion surface has a maximum peak height in a range of 20 µm to 40 µm, where the protrusion surface is defined by the outer surface of the substrate, the outer surface comprising the protrusions.

4. The flow channel member according to claim 1, wherein the protrusions are in rows in a direction in which a fluid flows through the flow channel.

5. The flow channel member according to claim 1, wherein the protrusions are located only in a region of a protrusion surface except a region corresponding to the flow channel, where the protrusion surface is defined by the outer surface of the substrate, the outer surface comprising the protrusions.

6. A semiconductor module, comprising:
the flow channel member according to claim 1;
a metal layer on a protrusion surface of the flow channel member,
the protrusion surface including the protrusions; and
a semiconductor device on the metal layer.

7. A heat exchanger, comprising:
a plurality of flow channel members each including
a substrate containing a ceramic and comprising a flow channel inside thereof, and
a plurality of protrusions disposed on an outer surface of the substrate;
a fluid inlet member disposed between the flow channel members and communicating with inlet ports of the flow channels in the respective flow channel members; and
a fluid outlet member disposed between the flow channel members and communicating with outlet ports of the flow channels in the respective flow channel members,
the fluid inlet member and the fluid outlet member being each joined to the flow channel members at portions including the protrusions.

* * * * *